United States Patent
Tahon et al.

(10) Patent No.: US 7,214,405 B2
(45) Date of Patent: May 8, 2007

(54) METHOD OF MAKING A LIQUID CRYSTAL ALIGNMENT LAYER

(75) Inventors: Jean-Pierre Tahon, Langdorp (BE); Tom Cloots, Londerzeel (BE); Roger Bäuerle, Stuttgart Vaihingen (DE)

(73) Assignee: Agfa-Gevaert, N.V., Mortsel (BE)

( * ) Notice: Subject to any disclaimer, the term of this patent is extended or adjusted under 35 U.S.C. 154(b) by 0 days.

(21) Appl. No.: 10/653,068

(22) Filed: Sep. 3, 2003

(65) Prior Publication Data

US 2004/0041969 A1 Mar. 4, 2004

Related U.S. Application Data

(62) Division of application No. 09/689,632, filed on Oct. 13, 2000.

(60) Provisional application No. 60/162,196, filed on Oct. 29, 1999.

(30) Foreign Application Priority Data

Oct. 15, 1999 (EP) .................................. 99203378

(51) Int. Cl.
*B05D 5/06* (2006.01)

(52) U.S. Cl. .................. 427/162; 427/163.1; 427/164; 427/165; 427/256; 427/258; 427/261; 427/286; 427/355; 427/358; 427/371; 428/1.2; 349/123; 349/124; 349/126; 349/135

(58) Field of Classification Search ................ 427/162, 427/163.1, 164, 165, 256, 258, 261, 286, 427/355, 358, 371; 428/1.2; 349/123, 124, 349/126, 135
See application file for complete search history.

(56) References Cited

U.S. PATENT DOCUMENTS

| 5,300,575 A | * | 4/1994 | Jonas et al. ................. 525/186 |
| 5,427,841 A | * | 6/1995 | De Leeuw et al. ......... 428/209 |
| 5,465,169 A | * | 11/1995 | Eguchi ........................ 349/124 |
| 5,597,626 A | * | 1/1997 | Eguchi ........................ 428/1.4 |
| 5,748,271 A | * | 5/1998 | Hikmet et al. ................ 349/69 |
| 5,766,515 A | * | 6/1998 | Jonas et al. .................. 252/500 |

FOREIGN PATENT DOCUMENTS

| EP | 0 449 047 A2 | * | 10/1991 |
| JP | 06-148648 A | * | 5/1994 |
| WO | WO 97/18944 A1 | * | 5/1997 |

OTHER PUBLICATIONS

Dae-Shik Seo et al: "A Study Of High Pretilt Angle Generation In Nematic Liquid Crystal (5CB) On Rubbed Polythiophene Surfaces With Alkyl Chain Lengths"; Jpn. J. Appl. Phys., vol. 35 (1996), pp. 3531-3532, Part 1, No. 6A, Jun. 1996; XP-000735519.

* cited by examiner

*Primary Examiner*—Alain L. Bashore
(74) *Attorney, Agent, or Firm*—Breiner & Breiner, LLC

(57) ABSTRACT

A method of making a liquid crystal alignment layer comprising the steps of: (i) providing a layer on a substrate, the layer comprising a polythiophene according to formula (I):

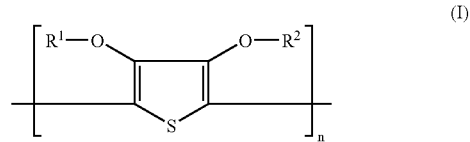

wherein $R^1$ and $R^2$ each independently represent hydrogen or a $C_1$–$C_4$ alkyl group or together represent a $C_1$–$C_4$ alkylene group or a cycloalkylene group; and (ii) mechanically rendering the layer liquid crystal aligning; a liquid crystal alignment layer obtainable by the above-mentioned method; a liquid crystal device incorporating the above-mentioned liquid crystal alignment layer; a liquid crystal display comprising the above-mentioned liquid crystal alignment layer or the above-mentioned liquid crystal device; and the use of the polythiophene according to formula (I) for aligning liquid crystals.

12 Claims, No Drawings

United States Patent US 7,214,405 B2

METHOD OF MAKING A LIQUID CRYSTAL ALIGNMENT LAYER

RELATED APPLICATIONS

The present application claims benefit of U.S. Provisional Application 60/162,196 filed Oct. 29, 1999, and is a division of U.S. application Ser. No. 09/689,632 filed Oct. 13, 2000.

FIELD OF THE INVENTION

The present invention relates to a method of making a liquid crystal alignment layer; and a liquid crystal alignment layer obtainable therewith.

BACKGROUND OF THE INVENTION

Liquid crystal displays (LCDs) typically contain a display cell consisting of two sandwiched substrates which each carry at their inner surface a patterned electroconductive layer and a liquid crystal alignment layer. These substrates are kept apart by so-called spacers and the volume thus obtained is filled with a liquid crystal composition. The orientation of the liquid crystal molecules therein is determined by an interaction with the liquid crystal alignment layer which may contain anisotropically oriented polymer molecules. Upon application of an electric field, the orientation of the liquid crystal molecules can be switched from one orientation to another, and a modulation of the light output through crossed polarisers is thereby obtained.

Generally, the substrates in LCDs consist of glass. At present, several key display technologies are being developed in the industry to make flexible displays wherein plastic foils can be used as a substrate. A truly flexible display should not contain inorganic layers on the plastic substrate, since the brittleness of inorganic compositions causes the formation of defects upon bending the display. As a replacement of indium-tin oxide (ITO), the most commonly used electroconductive composition, conducting polymers such as polythiophene can be used. Such replacement of inorganic layers by organic equivalents enables the use of cheaper, easier-to-build, roll-to-roll coating methods for making flat panel displays.

The liquid crystal alignment layers in most of today's LCDs are oriented polyimide (PI) layers. Known since the very beginning of LCD technology, these PI layers have remained essentially unchanged for 25 years. The method of making PI alignment layers is complex and requires careful control of many parameters which may affect the final quality of the display. Typically, the following steps are needed to obtain a PI alignment layer: (1) cleaning the substrate, effected through a sequence of several substeps such as supersonic washing in aqueous solutions, rinsing, supersonic washing in pure water, rinsing, supersonic washing in an organic solvent, blowing with nitrogen, drying, and finally UV photo-cleaning; (2) spin coating the PI precursor (a solution of PI monomers in an organic solvent) and baking to cure the coated layer, typically at a temperature between 200 and 350° C.; and (3) orientation of the PI molecules by stretching or shearing techniques, or more preferably, by rubbing with a rayon, cotton or velvet cloth. The baking step is generally performed in vacuum, otherwise the PI alignment layer does not adhere well to the substrate and may be disrupted during rubbing, especially at the areas of the patterned electroconductive layer at which the ITO layer has been etched out.

The high temperature required during the baking step as well as the use of various organic solvents renders these prior art methods incompatible with many plastic substrates. Other problems are associated with the low stability of the PI precursor (must be stored at low temperature) and the disposal of organic solvents and other chemicals which are necessary in these conventional methods. The build-up of electrostatic charges in the PI layer, e.g. during rubbing, is a particularly serious problem as dust particles are attracted thereby, which, once trapped in the display cell, may cause poor alignment, severe wedging of the substrates or electrical breakdown by short circuiting across the dust particle.

In order to solve these problems, alternative methods have been described to obtain LCD alignment layers. Photo-alignment methods such as the anisotropic cross-linking of poly(vinyl cinnamate) and PI films by exposure to linearly polarised UV light have been described (Applied Physics Letters, volume 73, p. 3372, published in 1998). Such methods are also suitable for aligning polythiophene layers, but are not a suitable alternative for conventional PI layers because of their thermal instability. The problem of electrostatic charge generation may also be solved by making electroconductive alignment layers as described in U.S. Pat. No. 5,639,398, which discloses the coating of a viscous lyotropic polyaniline solution on ITO and then orienting by shearing with a blade of a knife or a glass plate. While drying, the liquid crystalline polyaniline molecules retain their orientation. However, the conductivity values of the polyaniline layer reported in U.S. Pat. No. 5,639,398 are low, so ITO is still needed as an electrode layer.

U.S. Pat. No. 5,465,169 discloses a liquid crystal device, comprising a pair of substrates each having an electrode thereon and a liquid crystal disposed between the substrates, wherein at least on of the substrates is provided with an electroconductive protective film and also an alignment film comprising an alignment material and a polymeric electroconductive compound. This polymeric electroconductive compound may preferably be a basic polymer, examples of which may suitably include polypyrrole, polyaniline and derivatives thereof represented by formula (1) and (2), and polythiophene and derivatives thereof. According to the invention of U.S. Pat. No. 5,465,169 it is preferred that the alignment material constituting the alignment film comprises a compound having an acidic functional group so as to form a polymer complex having an improved electroconductivity between the alignment material and the polymeric electroconductive compound, suitable examples of such alignment material including polyimides, polyamideimides and precursors thereof.

EP-A 449 047 discloses a liquid crystal device comprising a pair of opposing substrates and a liquid crystal rendering a chiral smectic phase, disposed between the pair of substrates, wherein at least one of the substrates is provided with an alignment film comprising a polymer containing a skeleton selected from the group consisting of acetylene, phenylene, phenylenevinylene, phenylenexylidene, benzyl, phenylene sulfide, dimethylparaphenylene sulfide, thienylene, furan, selenophene, vinylpyridine, vinylnaphthalene, vinylferrocene, vinylcarbazole, phenylene oxide, phenylene selenide, heptadiyne, benzothiophene, thiophen, pyrrole, aniline and naphthylene. However, experimental evidence is only provided for polymer produced with p-xylylene and various polyparaphenylene precursors.

D-E. Seo, S. Kobayashi, M. Nishikawa and Y. Yabe in Journal of the Japanese Journal of Applied Physics, volume 35, pages 3531–3532, published in 1996, disclosed the dependence of the obtaining of pre-tilt angles in nematic liquid crystals on rubbed poly(3-alkyl-thiophene) surfaces upon alkyl chain length and established that the pre-tilt angle was less than 2° for alkyl chains with 1 to 8 carbon atoms, up to 5° depending on the rubbing strength for alkyl chains with 9 carbon atoms, up to 38° depending on the rubbing strength for alkyl groups with 10 carbon atoms and up to 70–80° depending on the rubbing strength with alkyl groups with 11 or 12 carbon atoms.

Currently used liquid crystal alignment layers require the use of high temperatures and/or the use of organic solvents or other hazardous chemicals and in general have to be used in association with an electroconductive compound. This rules out the use of many polymeric substrate materials in liquid crystal devices.

OBJECTS OF THE INVENTION

It is an object of the present invention to provide a liquid crystal alignment layer which may be obtained by a simple, convenient method that operates at low temperature, and does not require the use of organic solvents or other hazardous chemicals.

It is a further object of the present invention to enable the use of a wide range of polymeric substrate materials in liquid crystal devices.

It is another object of the present invention to provide an electroconductive liquid crystal alignment layer so that alignment by rubbing does not generate a build-up of electrostatic charge.

Further objects and advantages of the present invention will become apparent from the description hereinafter.

SUMMARY OF THE INVENTION

Surprisingly it has been found that polythiophenes substituted in the 3- and 4-positions with short-chain alkoxy-groups or in which the 3- and 4-positions are bridged with an optionally substituted oxy-alkylene-oxy group are capable of aligning liquid crystals, whereas it had been reported by D-E. Seo et al. in the Journal of the Japanese Journal of Applied Physics, volume 35, pages 3531–3532, published in 1996, that pre-tilt angles of less than 2° were obtained for alkyl chains with 1 to 8 carbon atoms, significant pre-tilt angles only being observed for alkyl chains with 9 or more carbon atoms. Coating of polythiophenes substituted in the 3- and 4-positions with short-chain alkoxy-groups or in which the 3- and 4-positions are bridged with an optionally substituted oxy-alkylene-oxy group and rubbing them to induce liquid crystal aligning properties can take place without the high temperatures and use of organic solvent required with the well-known polyimide (PI) liquid crystal alignment layers.

The above-mentioned objects are realized, according to the present invention, by a method of making a liquid crystal alignment layer comprising the steps of:

(i) providing a layer on a substrate, the layer comprising a polythiophene according to formula (I):

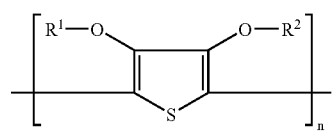

wherein $R^1$ and $R^2$ each independently represent hydrogen or a $C_1$–$C_4$ alkyl group or together represent a $C_1$–$C_4$ alkylene group or a cycloalkylene group; and (ii) mechanically rendering the layer liquid crystal aligning.

The above-mentioned objects are further realized, according to the present invention, by a liquid crystal alignment layer obtainable by the above-mentioned method.

The above-mentioned objects are also realized, according to the present invention, by a liquid crystal device comprising a pair of substrates each having an electrode thereon and a liquid crystal disposed between the substrates, wherein at least one of the substrates is provided with a layer system comprising the above-mentioned liquid crystal alignment layer.

The above-mentioned objects are also realized, according to the present invention, by the use of a polythiophene according to formula (I):

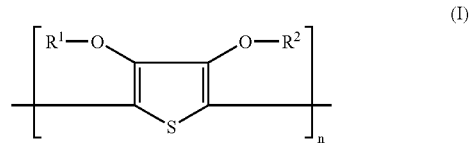

wherein $R^1$ and $R^2$ each independently represent hydrogen or a $C_1$–$C_4$ alkyl group or together represent a $C_1$–$C_4$ alkylene group or a cycloalkylene group, for aligning liquid crystals.

Specific features for preferred embodiments of the invention are defined in the dependent claims. Further advantages and embodiments of the present invention will become apparent from the following description.

DETAILED DESCRIPTION OF THE INVENTION

According to the present invention, it has been found that a layer containing polythiophene according to formula (I) is capable of aligning liquid crystal molecules just as the well-known polyimide (PI) liquid crystal alignment layers. Contrary to PI, the polythiophene-containing layer can be obtained by coating from an aqueous solution and does not require baking at high temperatures. Also unlike a PI-precursor, an (aqueous) polythiophene dispersion exhibits good long-term stability and the polythiophene layer is resistant to a wide variety of organic solvents such as propanol, acetone, butyl acetate, 1-methoxy-2-propanol, and cyclo-pentanone. By doping the polythiophene with a polyanion as described below, a layer can be obtained with a high electroconductivity so that no dust particles are attracted by the layer. A particular advantage of the present invention is that the electroconductivity of such a liquid crystal alignment layer comprising polythiophene according to formula (I) is sufficiently high, that it can also be used as an electrode for switching the liquid crystal phase of an LCD. The combined use of a layer according to the present invention as both an electrode and a liquid crystal alignment layer significantly reduces the cost of LCD manufacturing and enables the development of all-organic, flexible displays.

Definitions

The term "liquid crystal alignment layer" defines a layer which is capable of aligning liquid crystals and comprises a polymer, and optionally other ingredients. Such capability may be realized by mechanical rubbing in a particular direction, whereby some or all of the polymer molecules may become anisotropically oriented.

The term "substrate" is used in the meaning of a "self-supporting material" so as to distinguish it from a "layer" which may be coated on a substrate but which is not self-supporting. The terms support and substrate are used interchangeably in the description.

The term "electroconductive" is related to the electric resistivity of the material. The electric resistivity of a layer is generally expressed in terms of surface resistivity $R_s$ (unit $\Omega$; often specified as $\Omega/\square$). Alternatively, the electroconductivity may be expressed in terms of volume resistivity $R_v = R_s \cdot d$, wherein d is the thickness of the layer, or in units of conductance $k_i = 1/R_i$ (i=s,v; unit=S(iemens)=$1/\Omega$). $10^5$ $\Omega/\square$ is typically regarded as a value of surface resistivity which distinguishes electroconductive materials from antistatic materials. The term "electroconductive" as used herein should therefore be interpreted as "having a surface resistivity below $10^5$ $\Omega/\square$". Antistatic materials typically have a surface resistivity in the range from $10^6$ to $10^{11}$ $\Omega/\square$ and cannot be used as an electrode.

All values of electric resistivity presented herein are measured according to the following method. The substrate coated with the electroconductive layer is cut to obtain a strip having a length of 27.5 cm and a width of 35 mm. Over the width of the strip electrodes are applied at a distance of 10 cm. The electrodes are made of a conductive polymer, ECCOCOAT CC-2 available from Emerson & Cumming Speciality polymers. Over the electrode a constant potential is applied and the current flowing through the circuit is measured on a Pico-amperemeter KEITHLEY 485. From the potential and the current, taking into account the geometry of the area between the electrodes, the surface resistivity in $\Omega/\square$ is calculated.

Methods for Rendering the Layers According to the Present Invention Liquid Crystal Aligning A method of making a liquid crystal alignment layer is provided by the present invention comprising the steps of: providing a layer on a substrate, the layer comprising a polythiophene according to formula (I); and mechanically rendering said layer liquid crystal aligning.

The layer can be provided by coating a solution or dispersion to the substrate by any means known in the art: it can be spin-coated, sprayed or coated by any of the continuous coating techniques that are used to coat solutions on running webs or sheets.

The layer comprising polythiophene according to formula (I) can be rendered liquid crystal aligning by similar techniques to those used for making PI liquid crystal alignment layers. In a preferred method, a rotating screen printing roller provided with a velvet surface is translated over the polythiophene according to formula (I)-containing layer so as to apply a rolling friction on the surface of the layer. Parameters which influence the result (e.g. the so-called pre-tilt of the liquid crystal molecules) are the number of rubbing cycles, the contact length, the applied pressure which can be set by adjusting the distance between the roller and the layer surface (so-called pressure-depth), the radius of the roller, the rotation speed of the roller and the translation speed of the roller relative to the surface of the layer. These parameters can be controlled by using a screen printing apparatus according to the specifications of the supplier of the rubbing cloth and equipment. Other methods are also suitable, e.g. moving a carbon fibre brush or a doctor blade provided with a velvet or cotton cloth over the layer.

Polythiophenes According to Formula (I)

In the polythiophene according to formula (I):

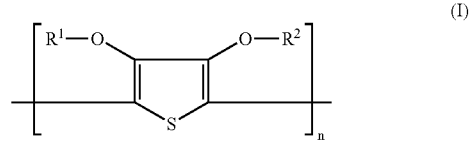

$R^1$ and $R^2$ each independently represent hydrogen or a $C_1$–$C_4$ alkyl group or together represent a $C_1$–$C_4$ alkylene group or a cycloalkylene group, with the methylene group, the 1,2-ethylene group, the 1,3-propylene and the 1,2-cyclohexene group being preferred and the 1,2-ethylene group being particularly preferred.

The term $C_1$–$C_4$ alkylene group includes methylene, 1,2-ethylene, 1,3-propylene, 1,2-propylene, 1,4-butylene, 1,3-butylene and 1,4-butylene groups. The term cycloalkylene group includes 1,2-cyclohexene and 1,2-cyclopentene groups.

The $C_1$–$C_4$ alkylene group or cycloalkylene group representing $R^1$ and $R^2$ together may be substituted by $C_1$–$C_8$ alkyl groups, $C_1$–$C_8$ alkoxy groups or a phenyl group with $C_1$–$C_8$ alkyl group-substituted methylene and $C_1$–$C_8$ alkyl group or phenyl group substituted 1,2-ethylene being preferred.

Preferred polythiophenes according to formula (I) are: poly(3,4-dimethoxy-thiophene), poly(3,4-diethoxy-thiophene), poly(3,4-di-n-propoxy-thiophene), poly(3,4-di-isopropoxy-thiophene), poly(3,4-di-n-butoxy-thiophene), poly(3,4-di-sec-butoxy-thiophene), poly(3,4-methylene-dioxy-thiophene), poly(3,4-ethylenedioxy-thiophene), poly[3,4-(1'-methyl)-ethylenedioxy-thiophene], poly[3,4-(1'-ethyl)-ethylenedioxy-thiophene], poly[3,4-(1'-n-propyl)-ethylenedioxy-thiophene], poly[3,4-(1'-n-butyl)-ethylenedioxy-thiophene], poly[3,4-(1-n-pentyl)-ethylenedioxy-thiophene], poly[3,4-(1'-n-hexyl)-ethylenedioxy-thiophene], poly[3,4-(1'-n-heptyl)-ethylenedioxy-thiophene], poly[3,4-(1'-n-octyl)-ethylenedioxy-thiophene], poly[3,4-(1'-phenyl)-ethylenedioxy-thiophene], poly[3,4-(1'-hydroxymethyl)-ethylenedioxy-thiophene], poly[3,4-propylenedioxy-thiophene], poly[3,4-(2'-methyl,2'-hydroxymethyl)-propylenedioxy-thiophene], poly[3,4-(2'-methyl)propylenedioxy-thiophene] and poly[3,4-(1,2-cyclohexylene)dioxy-thiophene]. A particularly preferred polythiophene according to formula (I) is poly(3,4-ethylenedioxy-thiophene).

Preparation of Polythiophenes According to Formula (I)

The preparation of a polythiophene according to formula (I) and of aqueous dispersions containing such a polythiophene are described in EP-A 440 957 and corresponding U.S. Pat. No. 5,300,575. Poly(3,4-dialkoxythiophene)'s can be produced as disclosed in U.S. Pat. No. 4,931,568. The synthesis of polythiophenes with an optionally substituted oxy-alkylene-oxy bridge between the 3- and 4-positions is disclosed in U.S. Pat. No. 5,111,327 and described by Chevrot et al. in Synthesis, volume 93, page 33, published in 1998; in Journal of Electroanalytical Chemistry, volume 443, page 217, published in 1998; Journal Chim. Phys., volume 95, page 1168, published in 1998; and Journal Chim. Phys., volume 95, page 1258, published in 1998.

Basically, the preparation of the polythiophenes indicated above proceeds by oxidative polymerisation of 3,4-dialkoxythiophenes or 3,4-alkylene-dioxythiophenes according to the following formula

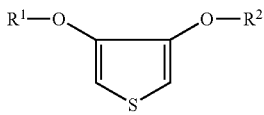

wherein $R^1$ and $R^2$ are as defined above.

In order to obtain high electroconductivity, the polythiophene is preferably doped by carrying out the polymerisation in the presence of a polyanion compound or a polyacid or salt thereof which may form a polyanion, as described in EP-A-440 957. Due to the presence of the polyanion, the polythiophene is positively doped, the location and number of the positive charges being not determinable with certainty and therefore not mentioned in the above formula of the repeating units of the polythiophene polymer.

Preferred polyacids or salts thereof are polymeric carbonic acids such as poly(acrylic acid), poly(methacrylic acid) and poly(maleic acid) or polymeric sulfonic acids such as poly(styrene sulfonic acid) or poly(vinyl sulfonic acid). Alternatively, copolymers of such carbonic and/or sulfonic acids and of other polymerizable monomers such as styrene or acrylates can be used. Poly(styrene sulfonic acid) is especially preferred. The molecular weight of these polyanion-forming polyacids is preferably between 1000 and $2 \times 10^6$, more preferably between 2000 and $5 \times 10^5$. These polyacids or their alkali salts are commercially available and can be prepared according to the known methods, e.g. as described in Houben-Weyl, Methoden der Organische Chemie, Bd. E20 Makromolekulare Stoffe, Teil 2, (1987), pp. 1141.

Stable aqueous polythiophene dispersions having a solids content of 0.05 to 55% by weight and preferably of 0.1 to 10% by weight can be obtained by dissolving a thiophene corresponding to the formula above, a polyacid or salt thereof and an oxidising agent in an organic solvent or preferably in water, optionally containing a certain amount of organic solvent, and then stirring the resulting solution or emulsion at 0 to 100° C. until the polymerisation reaction is completed. The oxidising agents are those which are typically used for the oxidative polymerisation of pyrrole as described in for example Journal of the American Chemical Society, Vol. 85, p. 454, published in 1963. Preferred inexpensive and easy-to-handle oxidising agents are iron(III) salts, e.g. $FeCl_3$, $Fe(ClO_4)_3$ and the iron(III) salts of organic acids and inorganic acids containing organic residues. Other suitable oxidising agents are $H_2O_2$, $K_2Cr_2O_7$, alkali or ammonium persulfates, alkali perborates, potassium permanganate and copper salts such as copper tetrafluoroborate. Air or oxygen can also be used as oxidising agents. Theoretically, 2.25 equivalents of oxidising agent per mole of thiophene are required for the oxidative polymerisation thereof (Journal of Polymer Science Part A, Polymer Chemistry, Vol. 26, p. 1287, published in 1988). In practice, however, the oxidising agent is preferably used in excess, for example in excess of 0.1 to 2 equivalents per mole of thiophene.

The polythiophene dispersions obtained according to the above method can then be used as the basic ingredient of a solution which can be coated on a substrate. The coating solution may also comprise additional ingredients, such as one or more binders, one or more surfactants, spacing particles, UV-filters or IR-absorbers. Suitable polymer binders are described in EP-A 564 911. Such binders may be treated with a hardening agent, e.g. an epoxysilane as described in EP-A 564 911, which is especially suitable when coating on a glass substrate.

Coating Process

The coating solution can be applied to the substrate by any means known in the art: it can be spin-coated, sprayed or coated by any of the continuous coating techniques that are used to coat solutions on running webs or sheets, e.g. dip coating, rod coating, blade coating, air knife coating, gravure coating, reverse roll coating, extrusion coating, slide coating and curtain coating. An overview of these coating techniques can be found in the book "Modern Coating and Drying Technology", Edward Cohen and Edgar B. Gutoff Editors, VCH publishers, Inc, New York, N.Y., published in 1992. It is also possible to coat multiple layers simultaneously by coating techniques such as slide coating and curtain coating. It is also possible to apply the coating solution to the substrate by printing techniques, e.g. jet printing, screen printing, gravure printing, flexo printing, or offset printing.

Polythiophene layers having a high electroconductivity can be obtained by adding to the coating solution an organic compound containing either two or more hydroxy and/or carboxy radicals; or at least one amide or lactam radical. Typical useful compounds are e.g. N-methyl-2-pyrrolidone, 2-pyrrolidone, 1,3-dimethyl-2-imidazolidone, N,N,N',N'-tetramethylurea, formamide, dimethylformamide, and N,N-dimethylacetamide. Highly preferred examples are sugar or sugar derivatives such as arabinose, saccharose, glucose, fructose and lactose, or di- or polyalcohols such as sorbitol, xylitol, mannitol, mannose, galactose, sorbose, gluconic acid, ethylene glycol, di- or tri(ethylene glycol), 1,1,1-trimethylol-propane, 1,3-propanediol, 1,5-pentanediol, 1,2,3-propanetriol, 1,2,4-butanetriol, 1,2,6-hexanetriol, or aromatic di- or polyalcohols such as resorcinol. The amount of these compounds in the coated layer may be between 10 and 5000 mg/m$^2$, preferably between 50 and 1000 mg/m$^2$.

The coating solution is preferably applied to the substrate in such an amount that the coated layer contains between 10 and 5000 mg of polythiophene per m$^2$, more preferably between 100 and 500 mg of polythiophene per m$^2$. Preferably, the coated layer has a surface resistivity below $10^5$ $\Omega/\square$, more preferably below $10^4$ $\Omega/\square$ and even more preferably below $10^3$ $\Omega/\square$. A highly preferred method for obtaining polythiophene layers with a surface resistivity of less than $10^3$ $\Omega/\square$ is described in EP-A 1 003 179.

Substrate

The substrate used in the materials of the present invention can be inorganic or organic. Suitable polymeric films are made of e.g. a polyester such as poly(ethylene terephthalate) (PET), poly(ethylene naphthalate) (PEN), poly(styrene), poly(ether sulfone) (PES), polycarbonate (PC), polyacrylate, polyamide, polyimides, cellulose triacetate, polyolefins, polyvinylchloride, cyclo-olefin copolymers such as polydicyclopentadiene (PDCP). PET, PEN, PES, PC and PDCP are highly preferred. As inorganic substrates can be used silicon, ceramics, oxides, polymeric film reinforced glass or, more preferably, glass or glass/plastic laminates, e.g. laminates as described in WO 99/21707 and WO 99/21708.

The polythiophene layer may be applied directly on the substrate, but, preferably, one or more intermediate layers are present between the substrate and the polythiophene layer.

Liquid Crystal Alignment Layer

In a preferred embodiment of the present invention, the liquid crystal alignment layer has a surface resistivity lower than $10^5$ $\Omega/\square$.

In a further preferred embodiment of the present invention, the liquid crystal alignment layer further comprises a polyanion.

In a further preferred embodiment of the present invention, the liquid crystal alignment layer is a patterned layer consisting of conducting and non-conducting areas.

In another preferred embodiment of the present invention, the liquid crystal alignment layer is not removed at non-conducting areas.

Anchor Layer

The substrate is preferably provided with an adhesion-improving so-called anchor layer, whereon the above described coating solution can be applied. Such an anchor layer may be present at either side of the substrate. Anchor layers may also act as a passivating layer, i.e. have barrier properties with regard to compounds which may diffuse from the substrate, e.g. unreacted monomer in case of a plastic substrate, into the liquid crystal alignment layer or other layers provided on the substrate. Such a passivating anchor layer comprises e.g. a cured polyimide or polyacrylate. A preferred passivating anchor layer comprises polyvinylalcohol and a silica dispersion, e.g. those supplied by Bayer AG, Leverkusen, West-Germany under the tradename KIESELSOL. The polyvinylalcohol/silica layer is preferably cured, e.g. by adding a tetra-alkoxysilane such as tetramethylorthosilicate and tetraethylorthosilicate. In a preferred embodiment of the liquid crystal device of the present invention, a passivating anchor layer is provided between at least one of said substrates and said liquid crystal alignment layer.

Other Layers of the Layer System on the Substrate

Other layers which may be present between the layer comprising polythiophene according to formula (I) and the substrate include UV filter layers, colour filter layers and transparent electroconductive layers such as ITO. The UV filter layer is preferably applied at the back side of the material of the present invention, i.e. at the side opposite to the polythiophene layer.

Electroconductive Layer

Especially when the liquid crystal alignment layer comprising polythiophene according to formula (I) of the present invention is not or not sufficiently electroconductive, it may be necessary to include an electroconductive layer between the substrate and the liquid crystal alignment layer according to the present invention. Any transparent organic or inorganic electroconductive material may be used e.g. vanadium pentoxide, cuprous iodide, transparent polythiophenes such as poly(3,4-ethylenedioxy-thiophene) etc., but an electoconductive layer comprising an indium-tin oxide layer is preferred.

Barrier Layer

The substrate, according to the present invention, may also be provided with barrier layers which prevent the diffusion of oxygen and/or water vapour through the substrate. Preferred barrier layers for use to this end include the known vacuum-deposited metal or metal oxide layers, e.g. $SiO_x$ layers, or the so-called organically modified ceramic layers, as described in Coating, no. 9/1998, p. 314 and 10/1997, p. 358, and the poly(hydroxy amide ethers) described in Macromolecules, vol. 31, p. 8281, published in 1998. A combination of a $SiO_x$ layer and an organically modified ceramic layer is especially preferred.

Optional Layer Configuration

Taking all the above into account, a specific example of a layer configuration on a substrate according to the present invention comprises the following layers (in the order given)

a liquid crystal alignment layer comprising a polythiophene according to formula (I)

a transparent electroconductive layer [e.g. indium-tin oxide (ITO)]

a passivating anchor layer a substrate an anchor layer an $SiO_x$ barrier layer an organically modified ceramic as a second barrier layer.

Patterning

LCDs are generally driven by a patterned (row/column) electroconductive layer, defining a pixel at each row-column overlap. According to a preferred embodiment of the present invention, liquid crystal alignment layer comprising polythiophene according to formula (I) is characterised by a surface resistivity of less than $10^4$ $\Omega/\square$, or even less than $10^3$ $\Omega/\square$, so that the layer can also be used as an electrode layer for most LCD applications and, as a result, the use of a separate ITO layer is not necessary. So in a preferred embodiment, the polymer layer of the present invention is a patterned, non-continuous electrode layer, which simultaneously acts as a liquid crystal alignment layer.

Several techniques are known in the art to obtain a patterned polythiophene layer. A first technique involves the image-wise application of a polythiophene paste by e.g. screen printing electrode paths as disclosed in Wo 99/34371. WO97/18944 discloses another suitable process wherein a positive or negative photoresist is applied on top of a layer of an organic electroconductive polymer, such as polythiophene, and after the steps of selectively exposing the photoresist to UV light, developing the photoresist, etching the electroconductive polymer layer with an oxidative agent such as ClO⁻ and finally stripping the non-developed photoresist, a patterned layer is obtained. A similar technique has been described in Synthetic Metals, volume 22, p. 265–271, published in 1988 for the design of an all-organic thin-film transistor. Research Disclosure No. 1473 (1998) describes photo-ablation as a method suitable for patterning organic electroconductive polymer layers, wherein the selected areas are removed from the substrate by laser irradiation.

A problem associated with the above patterning methods is the fact that no layer is present at the non-conducting areas (has been removed by etching or ablation or has not been applied from the start), so the liquid crystals can only be aligned at the conducting areas. Therefore, patterning methods are preferred wherein the non-conducting areas are not removed but 'de-activated', i.e. rendered non-conductive, e.g. by oxidation of the polythiophene according to formula (I). Having a similar layer thickness at conducting as well as non-conducting areas is also beneficial when the layer needs to be overcoated with very thin layers (no substantial step formation at the borders between conducting and non-conducting areas). Preferred patterning methods wherein the polythiophene is not removed at non-conducting areas include the one described in unpublished European Patent Application No. 99202705, filed on 23.08.1999, wherein a layer containing a polythiophene, a polyanion and a di- or polyhydroxy organic compound has a surface resistivity higher than $10^4$ $\Omega/\square$, which can be reduced to a value which is 10 to $10^5$ times lower by heating selected areas without substantially ablating or destroying the polymer layer. Finally, another suitable method involves the image-wise application of an oxidising composition to an electroconductive polythiophene layer, e.g. by screen printing a $ClO^-$ containing paste, as described in unpublished European Patent Application No. 99201645, filed on 20.05.1999. Although the layer thickness may be reduced slightly by the oxidation treatment, the conducting and non-conducting areas have a comparable layer thickness.

INDUSTRIAL APPLICATION

The present invention can be used for the manufacturing of passive-matrix LCDs as well as active-matrix LCDs such as thin-film-transistor (TFT) displays. Particular examples are twisted nematic (TN), supertwisted nematic (STN), double supertwisted nematic (DSTN), retardation film supertwisted nematic (RFSTN), ferro-electric (FLC), guest-host (GH), polymer-dispersed (PF), polymer network (PN) liquid crystal displays, and so on.

EXAMPLE

Preparation of a Polythiophene Dispersion (Hereinafter Referred to as "PT")

Into 3000 ml of an aqueous solution of 31.5 g of poly(styrene sulfonic acid) (171 mmole of $SO_3H$ groups) with number-average molecular weight (Mn) 40000, were introduced 25.7 g of sodium peroxodisulfate ($Na_2S_2O_8$), 0.225 g of $Fe_2(SO_4)_3.9H_2O$ and 12.78 g of 3,4-ethylenedioxy-thiophene. The thus obtained reaction mixture was stirred vigorously for 7 hours at 30° C. After adding a further 4.3 g of sodium peroxodisulfate ($Na_2S_2O_8$), the mixture was vigorously stirred for 14 hours at 30° C. The reaction mixture was then stirred twice for 2 hours at room temperature in the presence of a granulated weak basic ion exchange resin LEWATIT H 600 and strongly acidic ion exchanger LEWATIT S 100 (both trade names of Bayer AG, Leverkusen, Germany). The ion exchange resins were then filtered off and, finally, the mixture was post-heated at 95° C. for 2 hours. The resulting dark blue dispersion had a solid content of 1.15% by weight.

Coating of the Polythiophene Layer 417 mL of the above dispersion PT was mixed with a binder (8.5 mL of a 300 g/L aqueous dispersion of a copolymer of 88% vinylidene-chloride, 10% methylacrylate and 2% itaconic acid) and 50 g of N-methylpyrrolidone. Then, a surfactant was added (0.5 mL of FLUORAD FC430, trade name of 3M) and finally distilled water to make 1 liter. The solution thus obtained was coated at a wet thickness of 40 μm on a 100 μm polyethersulfone film and then dried at 35° C. The coated layer comprised 200 mg/m$^2$ of poly(3,4-ethylenedioxy-thiophene) doped with poly(styrene sulfonate). The thickness and surface resistivity of the layer were 0.2 μm and 600 $\Omega/\square$ respectively, i.e. the conductance $k_v$ was $1/(600\ \Omega)/(0.2 \times 10^{-4}\ cm)=83$ S/cm.

Patterning of the Polythiophene Layer

The above material was cleaned with a high-pressure water jet. Then a conventional photoresist layer of 1.4 μm thickness was spin-coated on the polythiophene layer and soft-baked at 120° C. for 10 min. The photoresist was then exposed through a mask film containing an image of five segments of different sizes, developed and hard-baked at 120° C. for 10 min. The material was dipped for 1 min. in a 12 wt. % solution of NaOCl to oxidise the polythiophene areas which were not covered by the photoresist layer. The oxidised areas are not removed by this treatment but 'de-activated' (rendered non-conductive). After rinsing with water, the photoresist was stripped with an acetone/isopropyl alcohol 1:1 (by volume) mixture for 10 min. followed by another treatment with isopropyl alcohol for 10 min. The material was then cleaned with a high-pressure water jet.

Rubbing of the Patterned Polythiophene Layer

The patterned polythiophene layer was rendered liquid crystal aligning with equipment supplied by Hornell-Automation (Sweden), type MELP RM-RR 400 Rub/Dry Cleaner. A velvet roller having a diameter of 120 mm, rotating at 800 rpm, was translated once over the polythiophene layer at a translation speed of 600 mm/min and a rubbing pressure depth of 100 μm.

Assembly of a Passive TN LCD Cell

Two of the above substrates were assembled to form a liquid crystal display cell by plotting a glue frame, spinning-on 5 μm spacer pearls, pressing the substrates into contact and UV-curing the glue frame. The cell was then filled with conventional twisted nematic LC material and sealed. Finally, crossed polariser sheets were laminated to the cell.

By applying the driving voltage to the above cell in front of a backlight, it was shown that the five segments could be switched without any cross-talk between the segments (sharp edges). A good normally white orientation of the TN material was obtained in the non-oxidised polythiophene areas.

The invention claimed is:

1. A method of making a liquid crystal alignment layer comprising steps of:
   (i) providing a layer on a substrate, said layer comprising a polythiophene according to formula (I):

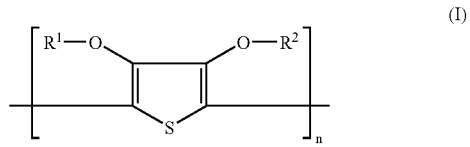

wherein $R^1$ and $R^2$ together represent a $C_1$–$C_2$ alkylene group or a cycloalkylene group and n is a whole number greater than 1, and a polyanion;
(ii) mechanically rendering said layer liquid crystal aligning, wherein said layer is a patterned layer consisting of conducting and non-conducting areas.

2. Method according to claim 1, wherein said layer is not removed at non-conducting areas.

3. A method of making a liquid crystal alignment layer comprising the steps of:
(i) providing a layer on a substrate, said layer comprising a polythiophene consisting of monomer units according to formula (I)

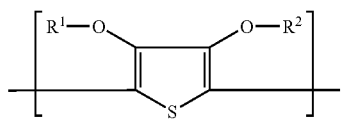
(I)

wherein $R^1$ and $R^2$ together represent a $C_1$–$C_4$ alkylene group or a cycloalkylene group, and a polyanion;
(ii) mechanically rendering said layer liquid crystal aligning, wherein said layer is a patterned layer consisting of conducting and non-conducting areas.

4. A method of making a liquid crystal alignment layer comprising the steps of:
(i) providing a layer on a substrate, said layer comprising a polythiophene consisting of monomer units according to formula (I):

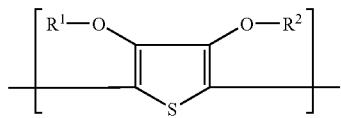
(I)

wherein $R^1$ and $R^2$ together represent a $C_1$–$C_4$ alkylene group or a cycloalkylene group, and a polyanion;
(ii) mechanically rendering said liquid layer crystal aligning, wherein said layer is a patterned layer consisting of conducting areas and non-conducting areas and wherein said layer is provided directly on said suvstrate.

5. Method according to claim 3, wherein said polythiophene according to formula (I) is poly(3,4-ethylene-dioxy-thiophene).

6. A method of making a liquid crystal alignment layer comprising the steps of:
(i) providing a layer on a substrate, said layer comprising a polythiophene consisting of monomer units according to formula (I):

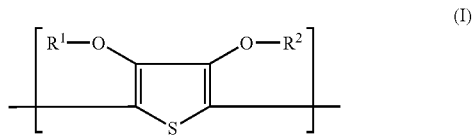
(I)

wherein $R^1$ and $R^2$ together represent a $C_1$-$C_4$ alkylene group or a cycloalkylene group, and a polyanion;
(ii) mechanically rendering said liquid layer crystal aligning, wherein said layer is a patterned layer consisting of conductung areas and non-conducting areas and wherein said conducting areas and non-conducting areas and wherein resistivity lower than $10^5$ $\Omega/\Delta$.

7. Method according to claim 3, wherein said layer is not removed at non-conducting areas.

8. Method according to claim 4, wherein said polythiophene according to formula (I) is poly (3,4-ethylene-dioxy-thiophene).

9. Method according to claim 4, wherein said conducting areas of said layer have a surface resistivity lower than $10^5$ $\Omega/\square$.

10. Method according to claim 4, wherein said layer is not removed at non-conducting area.

11. Method according to claim 6, wherein said polythiophene according to formula (I) is poly (3,4-ethylene-dioxy-thiophene).

12. Method according to claim 6, wherein said layer is not removed at non-conducting areas.

* * * * *

UNITED STATES PATENT AND TRADEMARK OFFICE
CERTIFICATE OF CORRECTION

| | |
|---|---|
| PATENT NO. | : 7,214,405 B2 |
| APPLICATION NO. | : 10/653068 |
| DATED | : May 8, 2007 |
| INVENTOR(S) | : Jean-Pierre Tahon et al. |

It is certified that error appears in the above-identified patent and that said Letters Patent is hereby corrected as shown below:

Column 7,
Line 58, "Fe(ClO$_4$)3" should read -- Fe(ClO$_4$)$_3$ --.

Column 10,
Line 26, "(in the order given)" should read -- (in the order given): --.

Column 10,
Line 55, "Wo 99/34371." should read -- WO 99/34371. --.

Column 11,
Line 51, "3000 ml" should read -- 3000 mL --.

Column 14,
Line 3, Claim 4, "suvstrate." should read -- substrate. --.

Column 14,
Lines 26-27, Claim 6, "and non-conducting areas and wherein" should read -- of said layer have a surface --.

Column 14,
Line 31, Claim 8, "poly (3,4-ethylene-" should read -- poly(3,4-ethylene --.

Column 14,
Line 39, Claim 11, "poly (3,4-ethylene-" should read -- poly(3,4-ethylene --.

Signed and Sealed this

Second Day of June, 2009

JOHN DOLL
*Acting Director of the United States Patent and Trademark Office*